United States Patent
Yamamoto

[19]

[11] Patent Number: 6,058,021
[45] Date of Patent: May 2, 2000

[54] STRUCTURE OF MOUNTING A SEMICONDUCTOR ELEMENT ONTO A SUBSTRATE

[75] Inventor: Seiichi Yamamoto, Kashihara, Japan

[73] Assignee: Sharp Kabushiki Kaisha, Osaka, Japan

[21] Appl. No.: 08/880,170

[22] Filed: Jun. 20, 1997

[30] Foreign Application Priority Data

Jul. 25, 1996 [JP] Japan ................................. 8-196479

[51] Int. Cl.[7] ...................................................... H05K 3/30
[52] U.S. Cl. ......................... 361/783; 361/751; 257/778; 257/787; 257/788; 174/260; 228/180.22; 438/616; 29/840; 29/841
[58] Field of Search .................................. 361/750, 749, 361/751, 760, 768, 771, 782, 783; 174/256, 258, 259, 257, 260; 228/179.1, 180.22; 438/FOR 371, 126, 127, 613–616; 29/856, 832, 840, 854, 855, 858, 841; 257/723, 724, 737, 738, 778, 787, 788, 789

[56] References Cited

U.S. PATENT DOCUMENTS

| | | |
|---|---|---|
| 3,764,436 | 10/1973 | Schmidt et al. ............................ 174/258 |
| 4,157,932 | 6/1979 | Hirata ........................................ 174/258 |
| 5,085,913 | 2/1992 | Wong ..................................... 264/272.13 |
| 5,128,746 | 7/1992 | Pennisi et al. ............................ 257/738 |
| 5,363,277 | 11/1994 | Tanaka ..................................... 361/760 |
| 5,386,624 | 2/1995 | George et al. .............................. 29/832 |
| 5,553,769 | 9/1996 | Ellerson et al. ..................... 228/180.22 |
| 5,579,573 | 12/1996 | Baker et al. ................................ 29/840 |
| 5,611,140 | 3/1997 | Kulesza et al. ............................. 29/832 |
| 5,651,179 | 7/1997 | Bessho et al. .............................. 29/832 |
| 5,714,252 | 2/1998 | Hogerton et al. ......................... 174/259 |
| 5,843,251 | 12/1998 | Tsukagoshi et al. ....................... 29/832 |
| 5,859,470 | 1/1999 | Ellerson et al. ........................... 257/778 |
| 5,895,971 | 4/1999 | Nakanishi .............................. 257/778 |

FOREIGN PATENT DOCUMENTS 1-199440  8/1989  Japan ............................. 438/FOR 371
6-97228   4/1994  Japan .

*Primary Examiner*—Leo P. Picard
*Assistant Examiner*—John B. Vigushin

[57] ABSTRACT

A semiconductor element/substrate mounting structure is formed by a first step of covering a resin film over the substrate together with a conductive portion; a second step of pressing and heating so that bumps penetrate through the resin film to come into contact with the conductive portion; and a third step of pressing and heating so that the bumps and the conductive portion become alloyed between the semiconductor element and the substrate.

12 Claims, 3 Drawing Sheets

STRUCTURE OF MOUNTING A SEMICONDUCTOR ELEMENT ONTO A SUBSTRATE

BACKGROUND OF THE INVENTION (1) Field of the Invention

The present invention relates to a structure of mounting a semiconductor element onto a substrate and a mounting method thereof, and in particular relates to a structure of mounting a semiconductor element onto a substrate and a mounting method thereof wherein a semiconductor element (chip) having bumps is mounted to a conductive portion of a flexible substrate or the like.

(2) Description of the Prior Art

Referring to FIGS. 1A–1D, the prior art will be described. FIGS. 1A through 1D show procedural diagrams showing a mounting method of a semiconductor element of a conventional example.

Consider a case as shown in FIG. 1A where a semiconductor chip 103 having bumps 102 consisting of gold is mounted to a flexible substrate 101 having a conductor pattern 100 as the conductive portion. Here, the surface of conductor pattern 100 is plated with tin. As to the number of the bumps, which corresponds to the number of terminals if the semiconductor chip is used as an IC, the chip has tens to hundreds of bumps, in general.

First, as shown in Fig. 1B, the substrate and the chip are placed so that bumps 102 contact conductor pattern 100, and then they are heated and pressed to each other. This process is performed at a temperature of 280° C. to 600° C., and each bump is about 100 μm square and is pressed with a load of 10 to 60 gf. As a result, bumps 102 and the tin plated on the surface of the conductor pattern, form an alloy layer 104 consisting of gold and tin, whereby semiconductor chip 103 is fixed and electrically connected to flexible substrate 101.

Next, as shown in FIG. 1C, fluid resin 105 is applied between semiconductor chip 103 and flexible substrate 101 and also fills up the chip side, finally producing a mounted structure of the semiconductor chip as shown in FIG. 1D.

FIG. 2 is a sectional view showing a mounting structure of a semiconductor element in accordance with another conventional example. Components having the same functions are allotted with the same reference numerals as those in FIGS. 1A–1D. In this example, an anisotropic conductive film 107 with conductive particles 106 dispersed therein is applied onto the surface of a flexible substrate 101 with a conductor pattern 100 formed thereon. A semiconductor chip 103 having bumps 102 is pressed over this anisotropic conductive film 107 while being heated. Bumps 102 and conductor pattern 100 on flexible substrate 101 are electrically connected by conductive particles 106 within anisotropic conductive film 107. Semiconductor chip 103 and flexible substrate 101 are bonded by anisotropic conductive film 107 cured by heat.

The applied pressure in this case is similar to that in the case of FIGS. 1A–1D while the temperature causing formation of an alloy layer as in FIGS. 1A–1D is not needed but it is only necessary to cure anisotropic conductive film 107; this means that the temperature is set at about 200° C.

In the conventional example shown in FIGS. 1A–1D, electrical tests, etc., are implemented for the finished product as shown in FIG. 1D. That is, the product is examined after alloy layer 104 has been formed between bumps 102 and conductor pattern 100 of flexible substrate 101, and resin 105 as filler has been applied. In this case, however, semiconductor chip 103 has already been fixed firmly to flexible substrate 101 by alloy layer 104.

Accordingly, if, from the electrical tests etc., semiconductor chip 103 turns out to be defective after the completion of the product, it is necessary to peel off conductor pattern 100 of flexible substrate 101 in order to remove the defective semiconductor chip 103. This means that flexible substrate 101 can not be reused, resulting in waste.

Further, in the heating step shown in FIG. 1B where alloy layer 104 is formed, tin on the surface of conductor pattern 100 of flexible substrate 101 tends to gather toward bumps 102. As a result, there are cases where alloy layer 104 largely spreads further out from the joint area between a bump 102 of semiconductor chip 103 and conductor pattern 100. The thus formed alloy layer 104 directly comes in contact with other neighboring bumps or other conductor patterns, causing edge leakage.

Further, since this substrate is a flexible one, if substrate 101 becomes bent at a portion A encircled in FIG. 3, the overrun alloy layer 104 is liable to contact the end face of semiconductor chip 103.

In the mounting structure and mounting method shown in FIG. 2, anisotropic conductive film 107 was used. However, conductive particles 106 can not always be dispersed uniformly within the film, conductive particles 106 may exist in relatively large densities at some places. These sites with a high particle density could cause damage to a circuit to be a joint area to semiconductor chip 103.

Further, conductive particles 106 should ideally function as electrical communication between bumps 102 and flexible substrate 101, but ununiformity of conductive particles 106 heightens the connection resistance, or causes unreliable connection, in the worst case, causing disconnection.

SUMMARY OF THE INVENTION

It is therefore an object of the present invention to provide a mounting structure of a semiconductor element and a production method thereof wherein if a semiconductor chip turns out to be defective after the completion of the product, it is possible to replace the defective chip so as to reuse the substrate and it is further possible to establish a reliable conduction without causing any edge leak problem, which occurred conventionally.

The present invention has been achieved to attain the above object, and the gist of the invention is as follows:

In accordance with the first aspect of the invention, a semiconductor element/substrate mounting structure of mounting a semiconductor element having bumps onto a conductor portion of a substrate via the bumps is characterized in that the bumps are alloyed so as to be integrated to the conductive portion on the substrate, the alloyed portion is formed penetrating through a resin film which is disposed so as to cover the substrate containing conductive portion.

In accordance with the second aspect of the invention, a semiconductor element/substrate mounting structure having the above first feature is characterized in that the substrate is of a flexible type.

In accordance with the third aspect of the invention, a semiconductor element/substrate mounting structure having the above first feature is characterized in that the resin film has characteristics which causes cross-linking at a temperature range within which the bumps and the conductive portion on the substrate become alloyed.

In accordance with the fourth aspect of the invention, a mounting method of a semiconductor element for mounting a semiconductor element having bumps so that the bumps are connected to a conductor portion of a substrate, includes:

a first step of covering a resin film over the substrate together with the conductive portion;

a second step of pressing and heating so that the bumps penetrate through the resin film to come into contact with the conductive portion; and a third step of pressing and heating so that the bumps and the conductive portion become alloyed between the semiconductor element and the substrate.

In accordance with the fifth aspect of the invention, a mounting method of a semiconductor element having the above fourth feature is characterized in that the substrate is of a flexible type.

In accordance with the sixth aspect of the invention, a mounting method of a semiconductor element having the above fourth feature is characterized in that the resin film has such a characteristic that no cross-linking reaction occurs during the second step and a cross-linking reaction occurs to cure the resin film during the third step.

According to the configuration described above, electrical tests are adapted to have been already carried out before the bumps of the semiconductor element and the conductive portion of the substrate are alloyed. Therefore, when a semiconductor chip is judged as defective from the tests, only the defective semiconductor chip can be replaced easily so that the substrate itself can be reused. Therefore, it is possible to reduce waste as compared to the conventional configuration, thus providing a cost benefit.

Further, since each bump is surrounded by the resin film when an alloy layer is formed by pressing and heating, no phenomenon occurs in which tin plating on the surface of the conductor pattern gathers toward the bumps thereby forming an alloy layer spreading out from the end face of the semiconductor chip , as mentioned as a problem in the prior art. As a result, it is possible to solve the problem of edge leakage which occurred in the conventional configuration.

The above effects are more effective especially for a flexible substrate having flexibility.

DESCRIPTION OF THE PREFERRED EMBODIMENTS

Figure 1A:
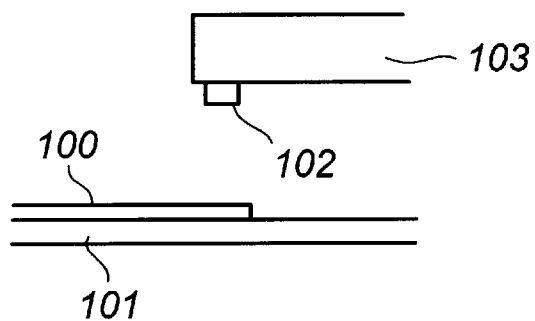
FIGS. 1A–1D are diagrams showing procedural steps of mounting a semiconductor element onto a substrate in accordance with a conventional example.
Figure 1B:
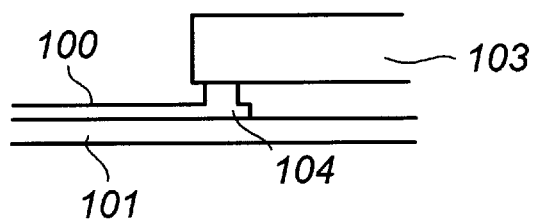
Figure 1C:
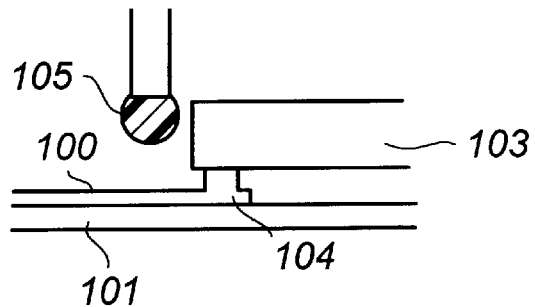
Figure 1D:
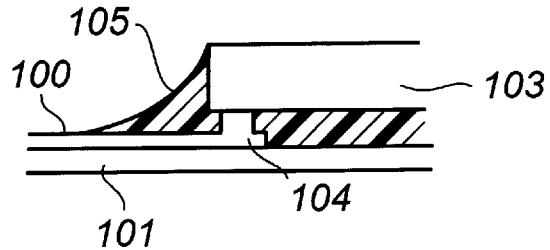

One embodiment of the present invention will hereinafter be described with reference to FIGS. 4A–4D. FIG. 4A through 4D are diagram showing procedural steps for illustrating a mounting method of a semiconductor element in accordance with this embodiment. Components having the same functions are allotted with the same reference numerals as those in the conventional example shown in FIGS. 1A–1D.

Figure 4A:
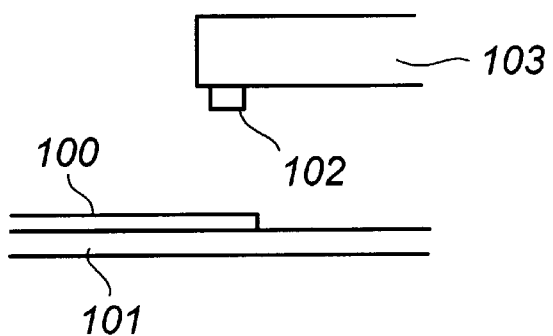
FIGS. 4A–4D are diagrams showing procedural steps of mounting a semiconductor element onto a substrate in accordance with an embodiment of the invention.

In this embodiment, as shown in FIG. 4A, a semiconductor chip 103 having bumps 102 consisting of gold is mounted onto a flexible substrate 101 with a conductor pattern 100 formed thereon. The insulating material in this flexible substrate 101 is made from polyimide or polyester and conductor pattern 100 is composed of copper. The surface of the copper is plated with tin.

Here, the tin plating of conductor pattern 100 is 0.1–5 $\mu$m in thickness, and the height of bump 102 is 5–50 $\mu$m.

Figure 4B:
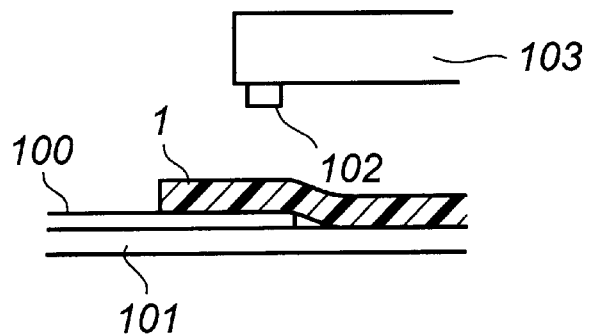

First, as shown in FIG. 4B, a resin film 1 is applied onto the surface of conductive pattern 100 and flexible substrate 101. The material of resin film 1 may use epoxy resin, polyester resin, fluororesin, or any combinations of these. More illustratively, for example, anisotropic conductive film 107 used in the conventional example in FIG. 2 with conductive particles 106 removed therefrom can be used. The thickness should be at least 10 $\mu$m and set greater than the height of bump 102.

Figure 4C:
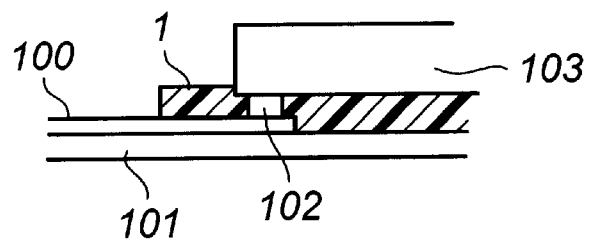

Next, as shown in FIG. 4C, bumps 102 of semiconductor chip 103 are pressed, while being heated, against conductor pattern 100 on flexible substrate 101 with the resin film 1 in between. This heating temperature is set at a range within which resin film 1 becomes softened but not cured. Here, the heating temperature was set at about 100° C.

Since the surface of bumps 102 as well as the tin-plated surface of conductor pattern 100 has been roughened because of crystal growth during plating, bumps 102 and conductor pattern 100 are brought into contact with each other penetrating resin film 1 during the above pressing and heating process.

When conductor chip 103 and flexible substrate 101 are electrically connected, necessary electrical tests etc. are implemented. At this stage, the final product assembly has not yet been finished, and the tests are implemented with the electrical connections temporarily completed. In this case, once bumps 102 are made into contact with conductor pattern 100, the connected state continues even through semiconductor chip 103 is not pressed against flexible substrate 101. Still, it is preferable to provide a slight pressure in order to ensure the electrical connection. From the result of these tests, if semiconductor chip 103 turns out to be defective, the semiconductor 103 is removed from the flexible substrate 101.

In the conventional configuration, since it is unavoidable that a defective chip be removed after the formation of alloy layer 104 between bumps 102 and conductor pattern 100, conductor pattern 100 is peeled off altogether when the defective chip is forcibly removed, making it impossible to reuse the substrate. In contrast, in accordance with this embodiment, bumps 102 are only put in contact with, but not connected to, conductor pattern 100, it is possible to easily remove only the defective chip without causing high stress in conductor pattern 100 of the flexible substrate.

Figure 4D:
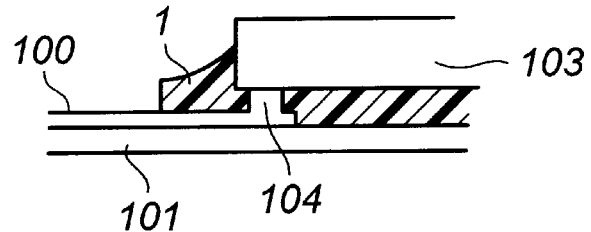

As a result of the electrical tests, if no problems are found, semiconductor chip 103 and flexible substrate 101 are pressed together whilst being heated so that bumps 102 and conductor pattern 100 form an alloy layer 104, thus completing a reliable chip-substrate connection, as shown in FIG. 4D. Here, the conditions of heating and pressing are the same as in the case of FIGS. 1A–1D. Specifically, this process is performed at a temperature of 280° C. to 600° C., and each bump is about 100 $\mu$m square and is pressed with a load of 10 to 60 gf.

When the above alloy layer 104 is formed, resin film 1 also becomes cured. In this way, it is necessary to achieve curing or hardening due to cross-linking in resin film 1 at a high temperature range within which the alloy layer can be formed. Accordingly, a resin film having characteristics of becoming cured at high temperatures is used in this embodiment.

As has been described heretofore, in this embodiment, since the electrical tests are implemented before the previous step shown in FIG. 4C, i.e., before forming an alloy layer 104 from bumps 102 of semiconductor chip 103 and conductor pattern 100 of flexible substrate 101, a defective semiconductor chip 103, if found, can be replaced easily so that flexible substrate 101 can be reused. This can reduce waste as compared to the conventional configuration, providing a cost benefit.

Further, because resin film 1 is punched by bumps 102 in the step shown in FIG. 4C, bumps 102 have been already covered with resin film 1 in the pressing and heating process for forming an alloy layer shown in FIG. 4D. Therefore, no phenomenon occurs in which tin plating on the surface of conductor pattern 100 gathers toward bumps 102 thereby forming an alloy layer spreading out from the end face of semiconductor chip 103, as mentioned as a problem in the prior art. As a result, it is possible to solve the problem of edge leakage which occurred in the conventional configuration.

Figure 3:
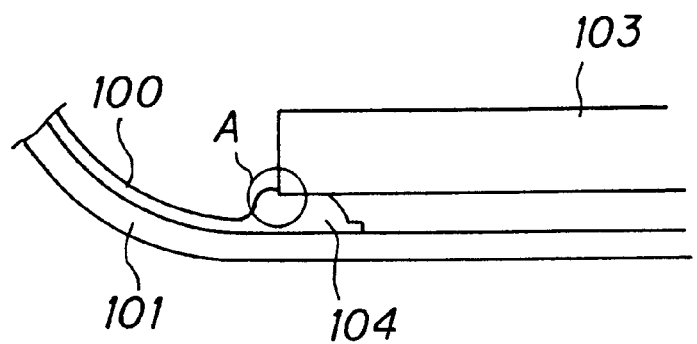
FIG. 3 is a sectional view for illustrating the problems of the conventional example shown in FIGS. 1A–1D.

When a flexible substrate which having flexibility is used as the substrate as in this embodiment, the substrate may be flexed during production or depending upon the use thereof as shown in FIG. 3. This caused edge leakage in the conventional configuration. However, according to this embodiment, this problem can be solved, so that this configuration is suitable, especially, for a flexible substrate etc., which has flexibility.

Figure 2:
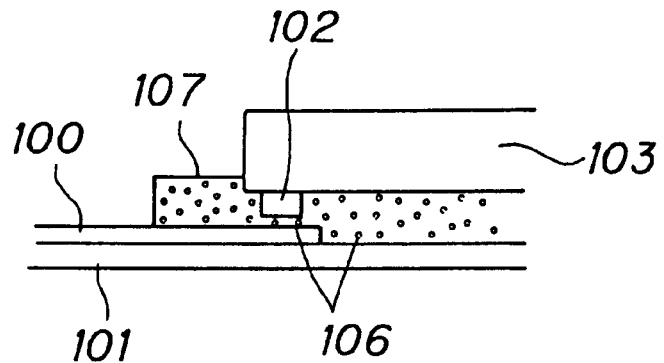
FIG. 2 is a sectional view showing a method of mounting a semiconductor element onto a substrate in accordance with another conventional example.

In this embodiment, in place of using an anisotropic conductive film as described in FIG. 2, the electrical connection between semiconductor chip 103 and flexible substrate 101 is made by alloy layer 104, so that it is possible to create reliable electrical connection.

Although gold was used as the material for bumps 102 and tin was used for plating the surface of conductor pattern 100 in the above embodiment, it is also possible to use solder as the material for bumps 102 and gold for plating conductor pattern 100 in a variational embodiment. In this case, the height of bumps 102 is set at 5–100 μm, and the thickness of the gold plating on conductive pattern 100 is preferably 0.05 μm or more. As to the temperature at a step corresponding to FIG. 4D, 200–350° C. is suitable. The pressure is set at the same as in the above embodiment.

Although flexible substrate 101 consisting of insulating material having conductor pattern 100 formed directly thereon is used as the substrate in the above embodiment, a configuration in which an adhesive layer is provided between the substrate and the pattern can be used. The material for the substrate is not limited as to its flexibility, hard substrates made up of organic materials, or ceramic substrates may be used. Materials which can be used as hard substrates include epoxy, glass epoxy, polytetrafluoroethylene, phenol resins. Materials which can be used as ceramic substrates include alumina, zirconia, silicon nitride and silicon carbide ceramics.

As described heretofore, according to the invention, when a semiconductor chip is judged as defective from the electrical tests etc., only the defective semiconductor chip can be replaced easily so that the substrate itself onto which a semiconductor chip is to be mounted can be reused. Therefore, it is possible to reduce waste as compared to the conventional configuration, thus providing a cost benefit.

Further, the alloy layer formed by the bumps of the semiconductor chip and the conductor pattern of the substrate will not spread out from the end face of the semiconductor chip so that it is possible to eliminate the conventional problem of edge leak where the alloy layer contacts other areas of the pattern etc., or the end of the semiconductor chip itself.

This invention, does not use an anisotropic conductive film, but uses an alloy layer to form electrical connection between the semiconductor chip and the substrate, so that it is possible to create reliable electrical connection.

What is claimed is:

1. A semiconductor element mounted on a substrate comprising:

the substrate with a conductive portion, the conductive portion having on a top surface a resin film, the resin film contacting only a part of the top surface of the conductive portion; and the semiconductor element including bumps which have an alloyed portion extending through the resin film, wherein the alloyed portion is formed of the bumps and the conductive portion.

2. A semiconductor element/mounted on a substrate according to claim 1, wherein the substrate is flexible.

3. A semiconductor mounted on a substrate according to claim 1, wherein the resin film has characteristics which cause cross-linking at a temperature range within which the bumps and the conductive portion on the substrate become alloyed.

4. The semiconductor element mounted on a substrate according to claim 1, wherein the resin film is a single element.

5. The semiconductor element mounted on a substrate according to claim 4, wherein the resin film has a first portion on the conductive portion and a second portion in direct physical contact with the substrate.

6. The semiconductor element mounted on a substrate according to claim 1, wherein the resin film is a non-adhesive film.

7. The semiconductor element mounted on a substrate according to claim 1, wherein the resin film defines a melted and solidified portion in an area where the alloyed portion extends through the resin film.

8. The semiconductor mounted on a substrate according to claim 7, wherein the resin film is free of flux.

9. The semiconductor mounted on a substrate according to claim 8, wherein the alloyed portion is an alloy of Au and Sn.

10. The semiconductor element according to claim 1, wherein the bumps are gold.

11. The semiconductor mounted on a substrate according to claim 1, wherein the resin film is free of flux.

12. The semiconductor mounted on a substrate according to claim 1, wherein the alloyed portion is an alloy of Au and Sn.

* * * * *